US005812489A

United States Patent [19]
Matsui

[11] Patent Number: 5,812,489
[45] Date of Patent: Sep. 22, 1998

[54] SINGLE-CHIP SYNCHRONOUS DYNAMIC RANDOM ACCESS MEMORY (DRAM) SYSTEM

[75] Inventor: Yoshinori Matsui, Tokyo, Japan

[73] Assignee: NEC Corporation, Tokyo, Japan

[21] Appl. No.: 823,688

[22] Filed: Mar. 25, 1997

[30] Foreign Application Priority Data

Mar. 29, 1996 [JP] Japan .................................. 8-076081

[51] Int. Cl.⁶ ...................................................... G11C 8/00
[52] U.S. Cl. ................ 365/233; 365/230.04; 365/230.08
[58] Field of Search .............................. 365/230.08, 233, 365/230.4; 326/93

[56] References Cited

U.S. PATENT DOCUMENTS

| | | | |
|---|---|---|---|
| 5,416,746 | 5/1995 | Sato et al. | 365/230.03 |
| 5,581,512 | 12/1996 | Kitamura | 365/233 |
| 5,592,434 | 1/1997 | Iwamoto et al. | 365/233 |
| 5,600,607 | 2/1997 | Furutani et al. | 365/233.5 |
| 5,657,292 | 8/1997 | McClure | 365/233 |

FOREIGN PATENT DOCUMENTS 61-163772  7/1986  Japan .
5-20891  1/1993  Japan .

OTHER PUBLICATIONS

Y. Takai et al.; "250 Mbyte/s Synchronous DRAM Using a 3–Stage–Pipelined Architecture"; IEEE Journal of Solid–State Circuits, vol. 29, No. 4, Apr. 1994, pp. 426–430.

Primary Examiner—David C. Nelms
Assistant Examiner—Hoai Ho
Attorney, Agent, or Firm—McGinn & Gibb, P.C.

[57] ABSTRACT

To use a central processing unit (CPU) operating with a high frequency clock signal, a synchronous dynamic random access memory (DRAM) system includes a signal generator for receiving a first clock signal and second clock signal sequentially, and for outputting a first latch signal after receiving the first clock signal and before receiving the second clock signal, a selecting circuit for selecting a first DRAM cell in a memory cell array in response to a first address signal, and for outputting first data of the first DRAM cell after the first clock signal is received by the signal generator, and a latch circuit for latching the first data when the first latch signal is outputted.

20 Claims, 11 Drawing Sheets

5,812,489

SINGLE-CHIP SYNCHRONOUS DYNAMIC RANDOM ACCESS MEMORY (DRAM) SYSTEM

BACKGROUND OF THE INVENTION

The present invention generally relates to a synchronous dynamic random access memory (DRAM) system, and more particularly to a synchronous DRAM system including a latch circuit for latching data from the DRAM and for outputting sequentially the data in response to clock signals from a central processing unit (CPU).

DESCRIPTION OF THE RELATED ART

With recent advancement of microprocessor technology, high-speed processing by computer systems such as workstations or personal computers as well as by main frames is achieved. The CPUs of some systems (e.g., RISC processors) have an operating frequency over 100 MHz.

On the other hand, single-chip DRAM devices used as a main storage unit or a storage unit for graphics in such computer systems, have been improved in their processing speed in response to the CPU's development. However, there is a big gap between their processing speeds. Therefore, a single-chip synchronous DRAM device has been developed for outputting data in response to high frequency clock signals of the CPU.

A synchronous DRAM device uses a pipeline circuit technique to improve its data transfer capability (e.g., for outputting data faster).

The pipeline circuit technique is a method of dividing the reading operation from address input to data output into a few steps (e.g., typically two or three steps), and each divided step is processed simultaneously by the CPU to realize high-speed operation.

For example, when using a pipeline circuit technique having three steps, first data is obtained in 30 ns (e.g., three clocks if using a CPU having an operation frequency of 100 MHz). Then, subsequent data are sequentially output every 10 ns because each step is operated simultaneously. In this manner, the first access time from address input to data output is the same as that of the conventional DRAM not using a pipeline circuit technique, but outputting speeds of the subsequent data become much faster than that of the conventional DRAM.

In the DRAM device using a pipeline circuit technique having three steps (e.g., a "three-step pipeline system"), three cycles (e.g., three clocks from the CPU) are required from an input of the column address to an output of data. Therefore, a three-step pipeline system has a CAS latency "3".

When the CPU has an operational frequency of less than 66 MHz, at least 45 ns are required for the synchronous DRAM device to output its first data if the system has a CAS latency "3". The time of 45 ns is much slower than 30 ns, thereby representing a time from inputting an address to outputting data of a conventional DRAM device which is not a synchronous DRAM device.

Therefore, the memory device is arranged to change the operation mode from a CAS latency "3" to a CAS latency "2".

FIG. 1 shows a (e.g., related art but not prior art) single chip synchronous DRAM device 1000 useful for understanding the present invention and with which the invention will be contrasted below and a CPU 100 for operating the device 1000. The device 1000 is a 16 M-bit synchronous DRAM device, and the device 1000 can change an operation mode between a CAS latency "3" and a CAS latency "2".

In a memory cell array 1, memory cells for 16M-bits are arranged, and 4096 word lines WL1–WLm (e.g., where "m" is 4096) and 512 column lines are provided. Eight memory cells correspond to one address. Therefore, a data width for one input/output equals 8-bit.

A signal generator 10x is activated when a chip select signal CS changes to an active level (e.g., "0") from an inactive level (e.g., "1"). The signal generator 10x receives a clock signal CK from CPU 100, and generates an internal clock signal ICK for controlling each step of the pipeline. The signal generator 10x also receives a row address strobe signal RAS, a column address strobe signal CAS and a write-enable signal WE, and outputs an output control signal OE, a read control signal RD and a load signal LD.

An address buffer 2 receives an address signal comprising twelve bits A0–A11 from CPU 100, and supplies it to a row decoder 3 as row address signals ADR. Further, the address buffer 2 sends bits A0–A8 of the address signal to a column address generator 4 as a column address signal ADC. The row decoder 3 decodes the row address signal ADR and changes a corresponding word line among the word lines WL1–WLm from an inactive level (e.g., "0") to an active level (e.g., "1") to select memory cells connected to the corresponding word line.

The column address generator 4 receives the column address signal ADC as a start address and sequentially outputs addresses IACs each of which comprises eight bits Y0–Y8 updated whenever the signal LD becomes an active level (e.g., "1") from an inactive level (e.g., "0").

The column decoder 5x decodes the column addresses IACs, and changes a corresponding signal among column selection signals CS1–CSn (where "n"=512) to an active level (e.g., "1") from an inactive level (e.g., "0") in response to the column address IACs, to select a memory cell connected to a corresponding column line.

A register 30 is programmed to latch either an active level (e.g., "1") or an inactive level (e.g., "0"), and outputs the level latched by the register 30 as a signal CL3.

A sense amplifier 6 amplifies data from memory cells selected by the row decoder 3 and the column decoder 5x, and outputs the amplified data to a global data bus GDB.

The latch circuit 8x is activated in response to the read control signal RD, latches data on the global data bus GDB and outputs the data to an output buffer 9 in response to the internal clock signal ICK.

The output buffer 9 is activated in response to an output control signal OE, and outputs data DT comprising eight bits D0–D7 received from the latch circuit 8x to the CPU 100. An input buffer 7 supplies data from the CPU 100 to the global data bus GDB during the writing operation.

FIG. 2 and FIG. 3 respectively show detailed circuit diagrams of the column decoder 5x and the latch circuit 8x. The operation of the device 1000 will be described by using timing charts of FIGS. 4 and 5. FIG. 4 shows a timing chart for a CAS latency "3", and FIG. 5 shows a timing chart for a CAS latency "2".

For the CAS latency "3", the register 30 outputs an active level as the signal CL3. The first step is from receiving the address signal AD outputted by the CPU 100, to outputting a decoded signal from a decoding portion 51 in FIG. 2 actually decoding the address signal IAC in the column decoder 5x. The second step is from latching the decoded signal in a latching portion 52 (e.g., comprising inverters IV 51 and IV 52 in FIG. 2), to latching data amplified by the sense amplifier 6 in a latching portion 861 (e.g., comprising inverters IV 51 and IV 52 in FIG. 3). The third step is from latching data latched by the latching portion 861 to a latching portion 862 (e.g., comprising inverters IV 83 and IV 84 in FIG. 3), to outputting the data to the CPU 100 through the output buffer 9. A transfer gate TG51 in FIG. 2, and transfer gates TG81 and TG82 in FIG. 3 comprise an N-type and a P-type metal oxide semiconductor (MOS) transistors. A NOR circuit G51 receives the internal clock signal ICK and an inverted signal CL3. A NAND circuit G80 receives the internal clock signal ICK and the read control signal RD. As shown in FIG. 4, the data k (e.g., where "k" is an integer greater than or equal to 1), representing a first data outputted from the memory cell array 1, is outputted to the CPU 100 within three clocks.

For the CAS latency "2", the register outputs an inactive level as the signal CL3. Therefore, the first step is from receiving the address signal AD outputted by the CPU 100, to latching data in a latching portion 52 in FIG. 2. The second step is from latching data latched by the latching portion 52 to a latching portion 861 in FIG. 3, to outputting the data to the CPU 100 through the output buffer 9. As shown in FIG. 5, the data k is outputted to the CPU 100 within two clocks.

However, for the CAS latency "2", if instead of the CPU 100, a CPU operating with higher operating frequency than that shown in FIG. 5 is connected to the device 1000, the device 1000 outputs wrong data, because the sense amplifier 6 cannot output data corresponding to k in FIG. 5 on the bus line GDB when a clock signal in time T1 in FIG. 5 occurs. For example, with such a CPU, the device 1000 may first output "data k+1" which would be mistakenly assumed to be data k (e.g., first data). Hence, data errors may result.

Therefore, the device 1000 cannot be connected to every CPU operating with high frequency. Moreover, besides the data errors mentioned above, with the higher and higher clock speeds of the CPU, the memory device 1000 cannot keep up and bottlenecks may arise.

SUMMARY OF THE INVENTION

In view of the foregoing problems of the conventional synchronous DRAM system, it is therefore an object of the present invention to provide an improved synchronous DRAM system.

Another object is to provide a structure and method of connecting a CPU having a higher clock frequency.

It is yet another object of the present invention to provide an improved latch circuit for latching data from a memory cell array in response to clock signals.

In a first aspect, a synchronous DRAM system according to the present invention includes a signal generator for receiving a first clock signal and a second clock signal sequentially, and for outputting a first latch signal after receiving the first clock signal and before receiving the second clock signal, a selecting circuit for selecting a corresponding DRAM cell in a memory cell array in response to a first address signal, and for outputting first data of the corresponding DRAM cell after the first clock signal is received by the signal generator, and a latch circuit for latching the first data when the first latch signal is outputted.

With the unique and unobvious structure of the present invention, the latch circuit can latch proper data although the data is outputted after a corresponding clock signal has occurred. Therefore, the system can process instructions properly even if a CPU having a high frequency clock signal is employed. Moreover, the system outputs proper data at all times and a "data k+1" or the like is not mistakenly output as (or assumed to be) data k.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF A PREFERRED EMBODIMENT OF THE INVENTION

Figure 6:
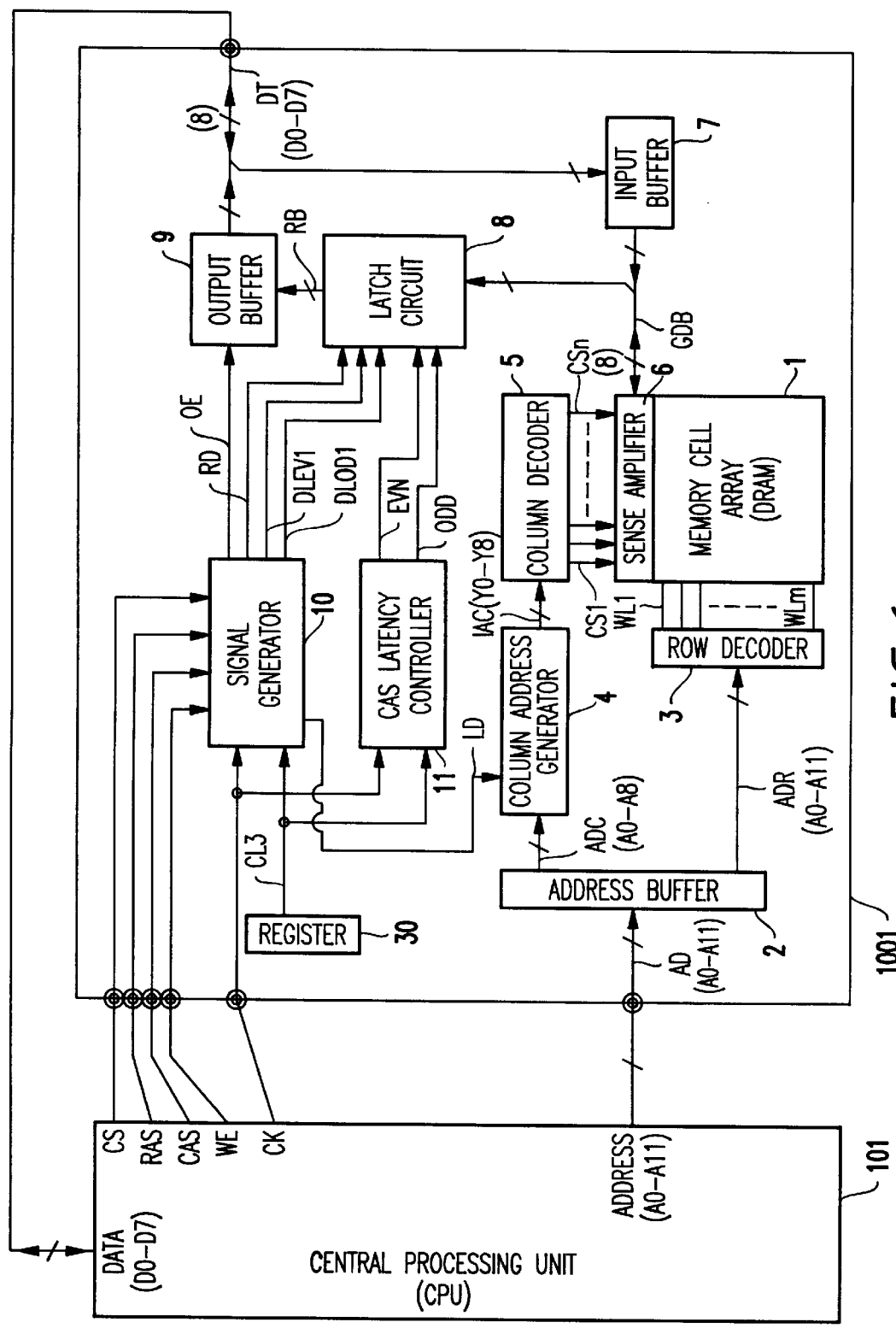
FIG. 6 is a diagram showing a synchronous DRAM system according to the present invention.

Referring now to the drawings, and more particularly to FIG. 6, a synchronous DRAM system includes a single-chip synchronous DRAM device 1001 and a CPU 101 for operating the device 1001 according to the present invention. The same parts in FIG. 6 as those in FIG. 1 are numbered with the same reference numerals in FIG. 1, and for brevity, explanations of these parts are omitted from the following description.

Figure 1:
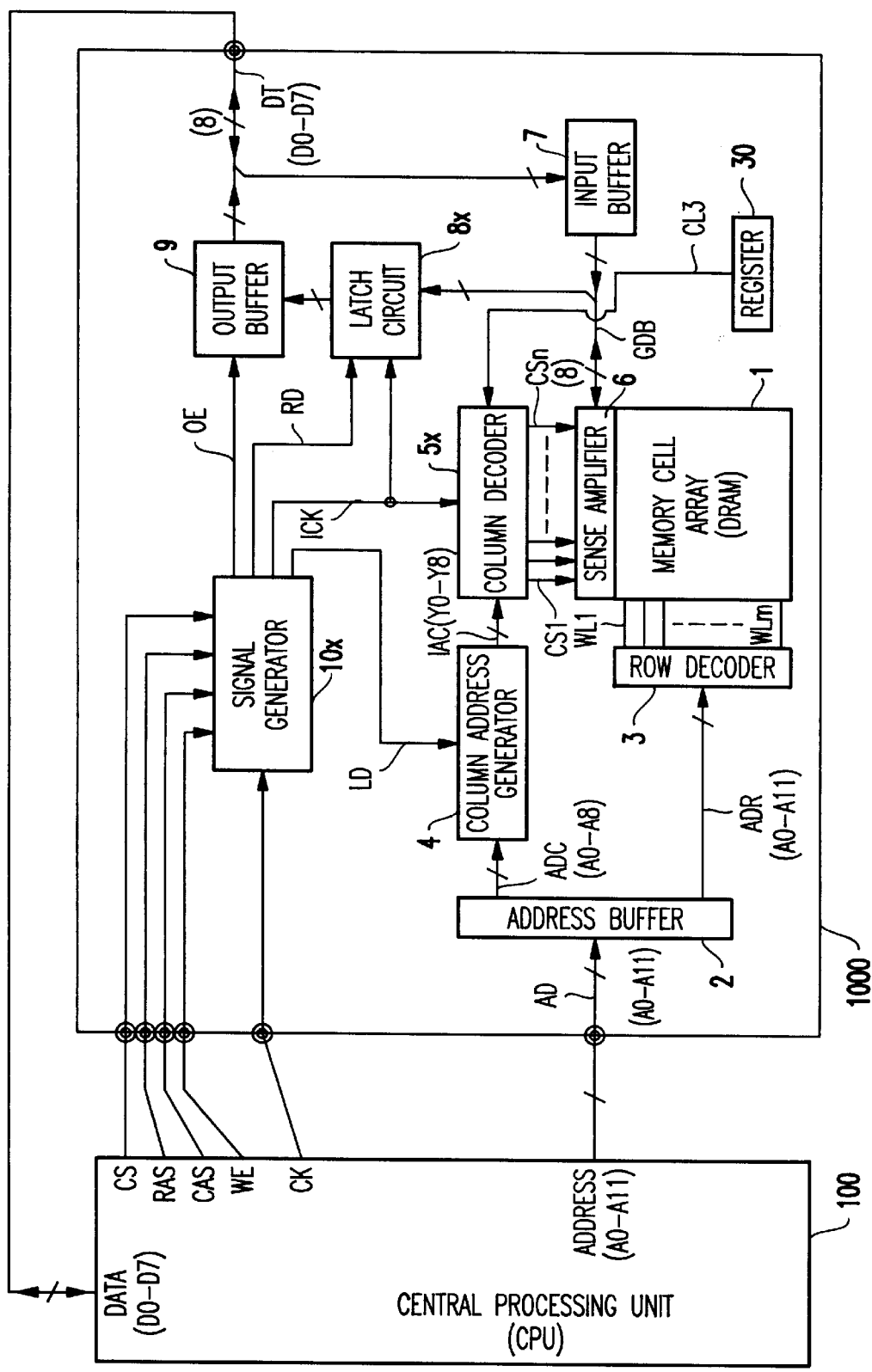
FIG. 1 is a diagram showing a (related art but not prior art) synchronous DRAM system.
Figure 2:
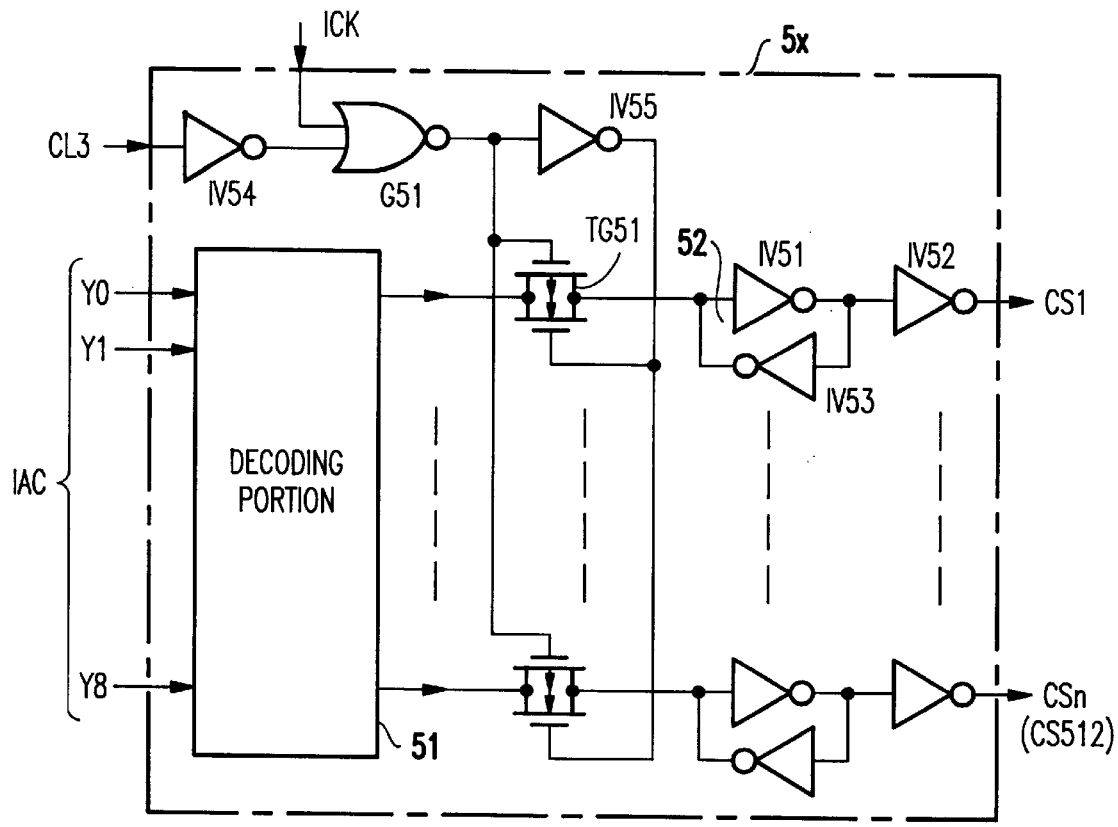
FIG. 2 is a circuit diagram showing a column decoder 5x in the synchronous DRAM system of FIG. 1.
Figure 3:
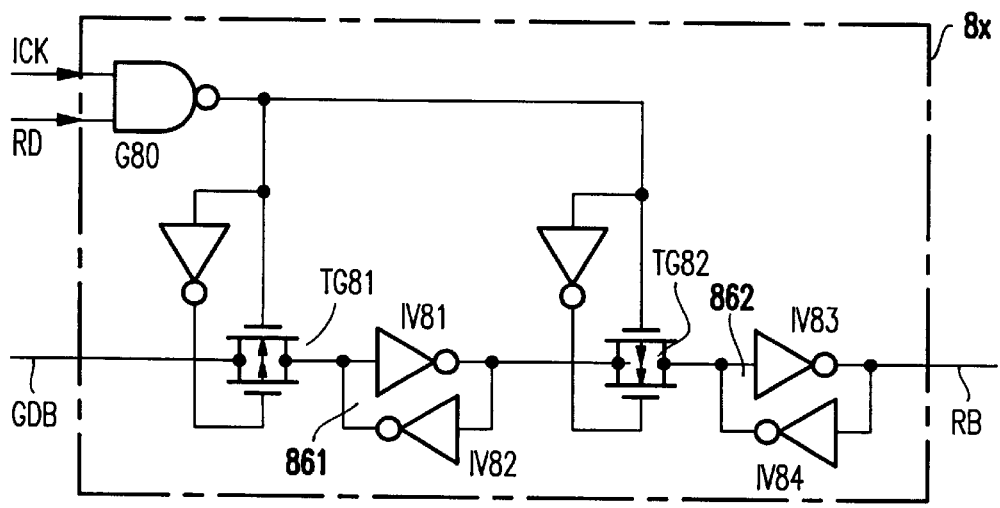
FIG. 3 is a circuit diagram showing a latch circuit 8x in the synchronous DRAM system of FIG. 1.
Figure 4:
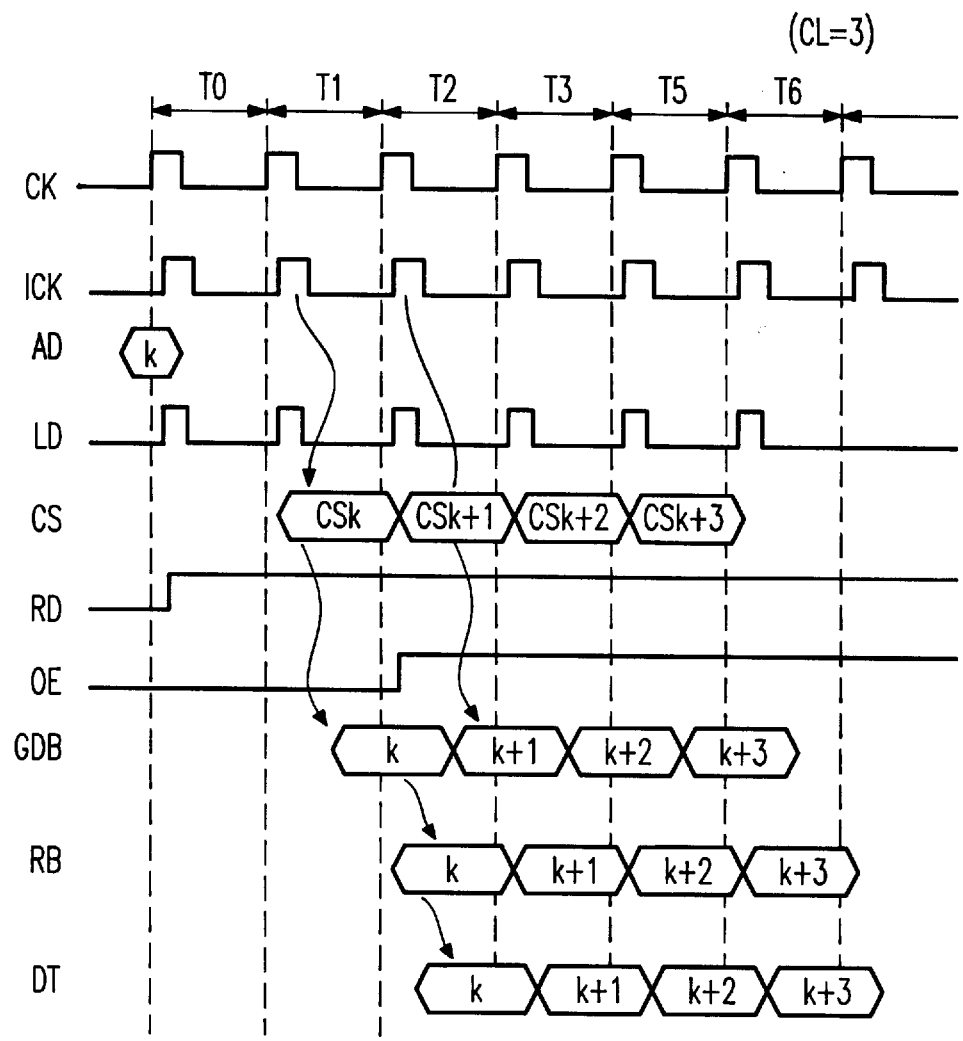
FIG. 4 is a timing chart for a CAS latency "3" in the synchronous DRAM system of FIG. 1.
Figure 5:
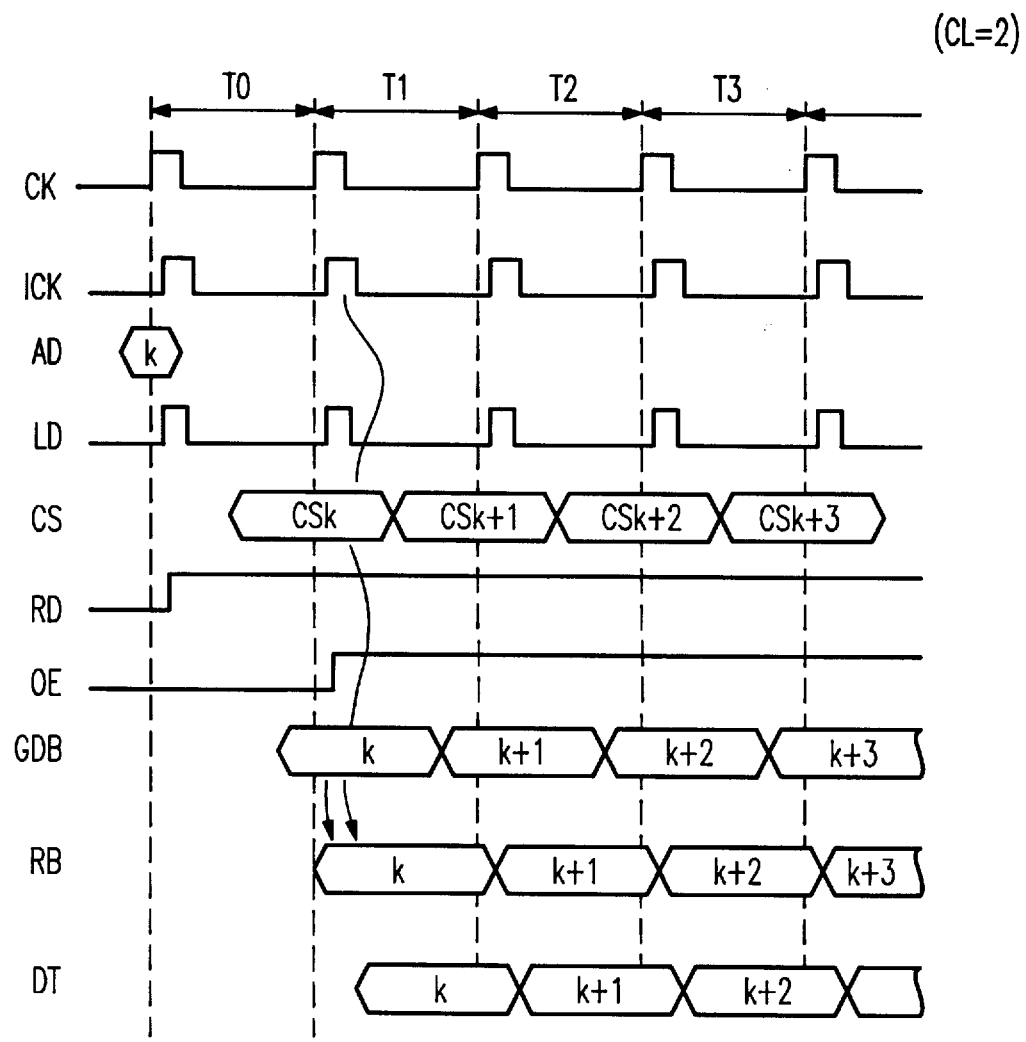
FIG. 5 is a timing chart for a CAS latency "2" in the synchronous DRAM system of FIG. 1.

In this embodiment, the device 1001 includes a column decoder 5 instead of the column decoder 5x in FIG. 1, a latch circuit 8 instead of the latch circuit 8x in FIG. 1, and a signal generator 10 instead of the signal generator 10x in FIG. 1. Further, the device 1001 includes a CAS latency controller 11 for outputting an EVN and an ODD signals in response to the clock signals CK and the signal CL3.

The signal generator 10 is activated when a chip select signal CS is changed from an inactive level (e.g., "1") to an active level (e.g., "0"). The signal generator 10 outputs a read control signal RD, an output control signal OE, a load signal LD, and data latch signals DLOD1 and DLEV1 by using a signal RAS, a signal CAS, and a write-enable signal WE (e.g., active levels of signals RAS, CAS, and WE are "0").

Figure 10:
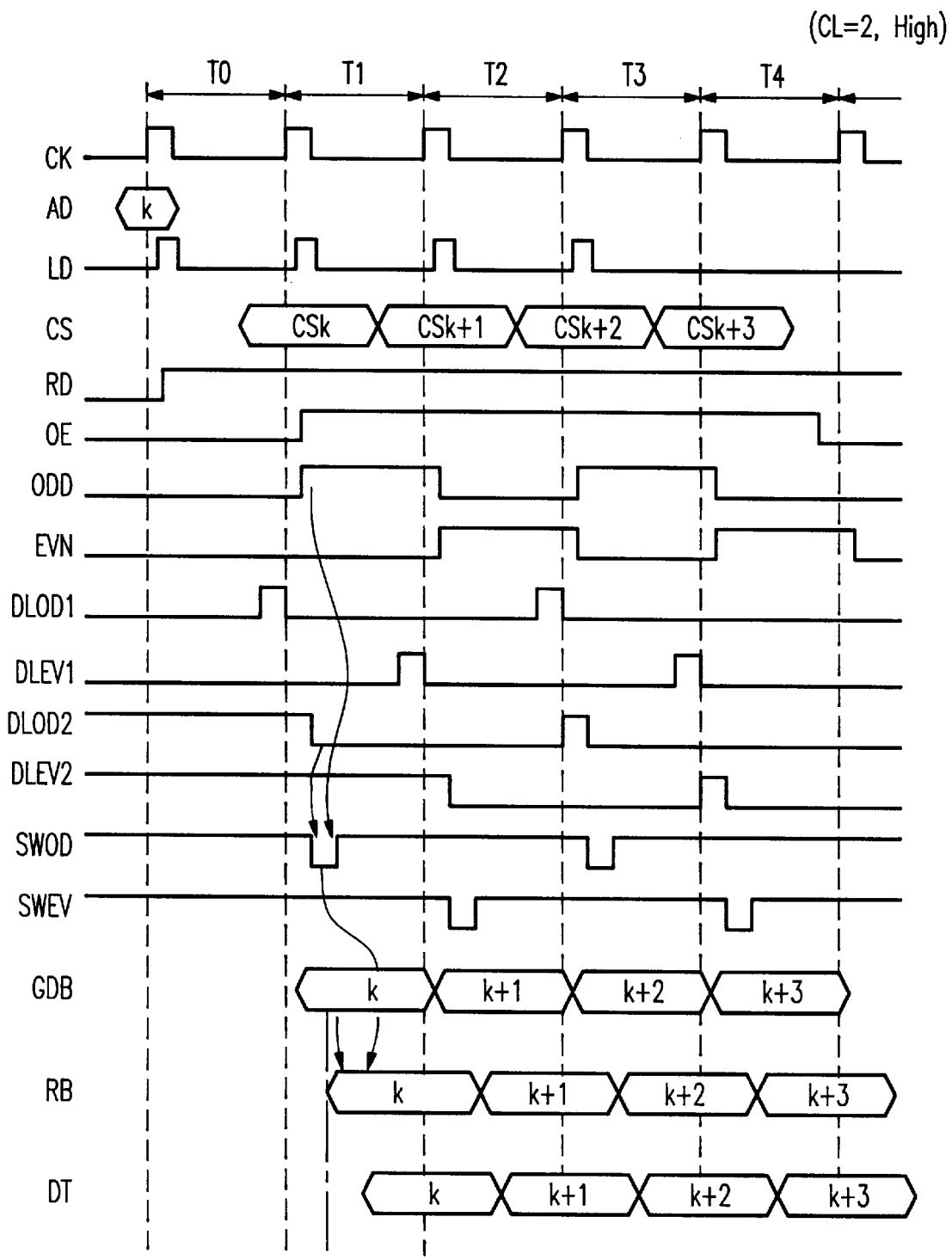
FIG. 10 is a timing chart for a CPU having high operational frequency for the CAS latency "2" according to the present invention.
Figure 11:
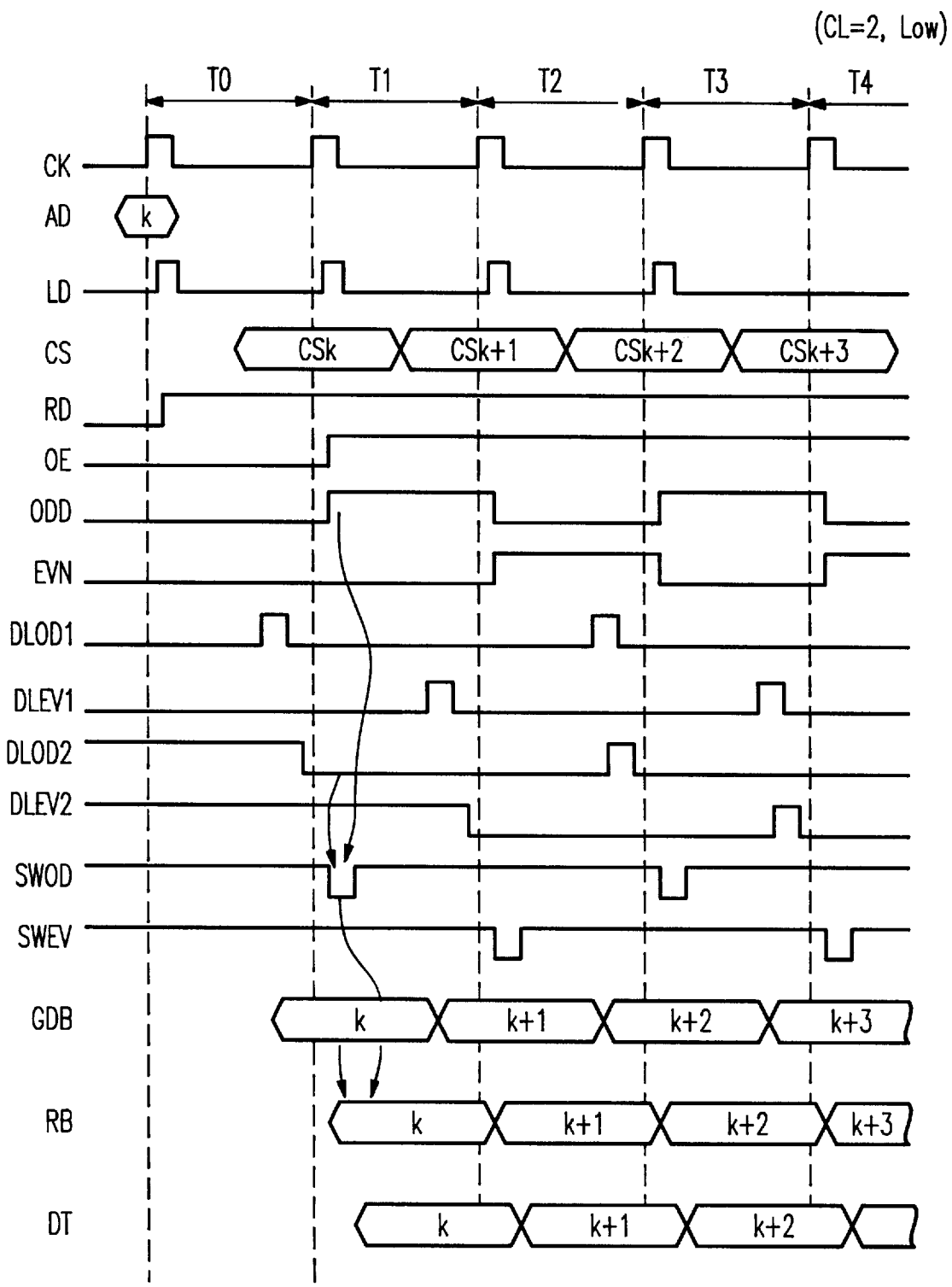
FIG. 11 is a timing chart for a CPU having low operational frequency for the CAS latency "2" according to the present invention.
Figure 12:
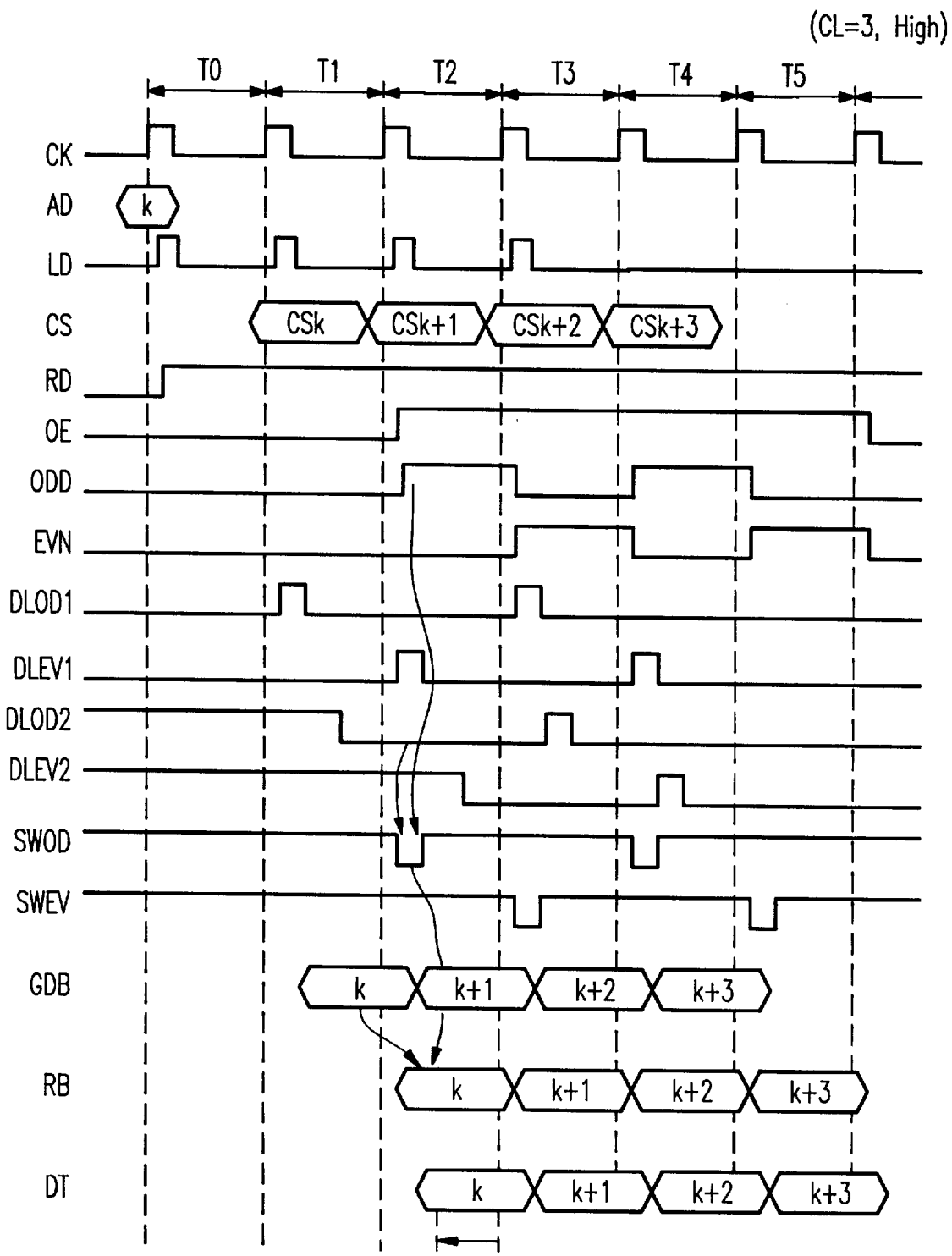
FIG. 12 is a timing chart for a CPU having high operational frequency for the CAS latency "3" according to the present invention.
Figure 13:
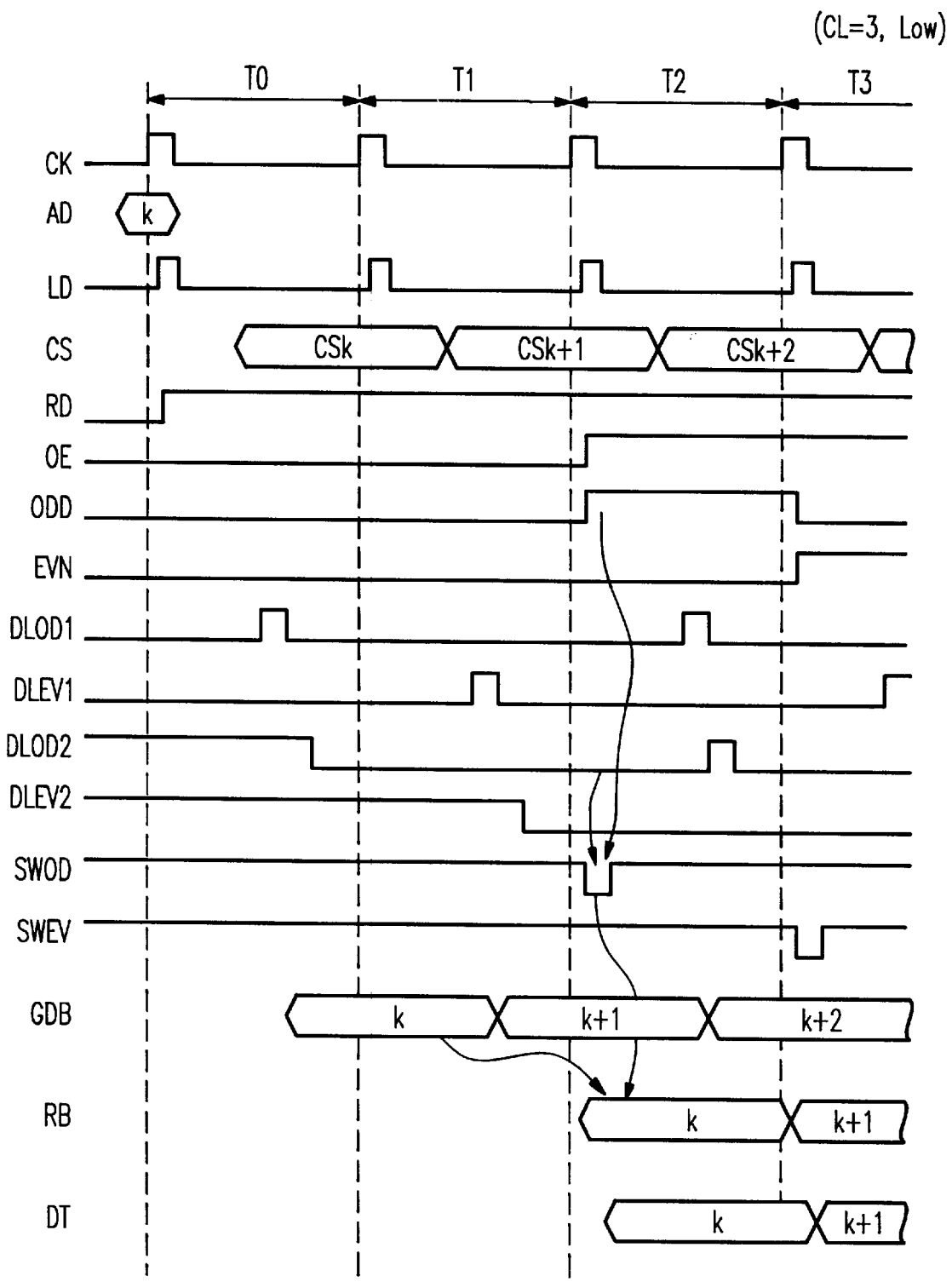
FIG. 13 is a timing chart for a CPU having low operational frequency for the CAS latency "3" according to the present invention.

Further, the signal generator 10 changes the signals RD, OE, DLEV1 and DLOD1 in response to the signal CL3 as shown in FIGS. 10 and 11 (e.g., for the CAS latency "2") and as shown in FIGS. 12 and 13 (e.g., for the CAS latency "3"). It is believed to be well within the grasp of an ordinary skilled artisan to make such a circuit according to these timing charts. Thus, for brevity, a detailed description of such a circuit is omitted herein.

The CAS latency controller 11 changes an EVN and an ODD signals by turns to an active level (e.g., "1") from an inactive level (e.g., "0") in response to the clock signals CK. Especially, for the CAS latency "2", the CAS latency controller 11 starts to change these signals from a time T1 as shown in FIGS. 10 and 11. For the CAS latency "3", the CAS latency controller 11 starts to change these signals from a time T2 as shown in FIGS. 12 and 13. It is believed to be well within the grasp of an ordinary skilled artisan to make such a circuit according to these timing charts. Thus, for brevity, a detailed description of such a circuit is omitted herein.

Figure 7:
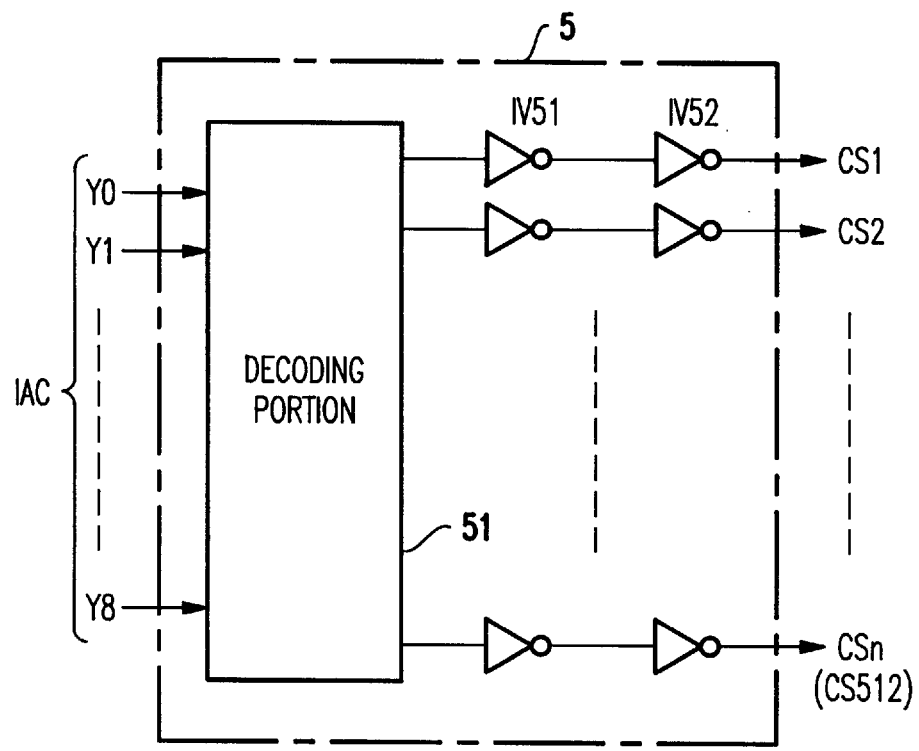
FIG. 7 is a circuit diagram showing a column decoder 5 of the DRAM system according to the present invention.

FIG. 7 shows a circuit diagram of column decoder 5. The column decoder 5 is a circuit for constantly outputting signals from the decoding portion 51 as column selection signals CS1–CSn through inverters IV51 and IV52 irrespective of CAS latency signals CL3 and clock signals CK.

Figure 8:
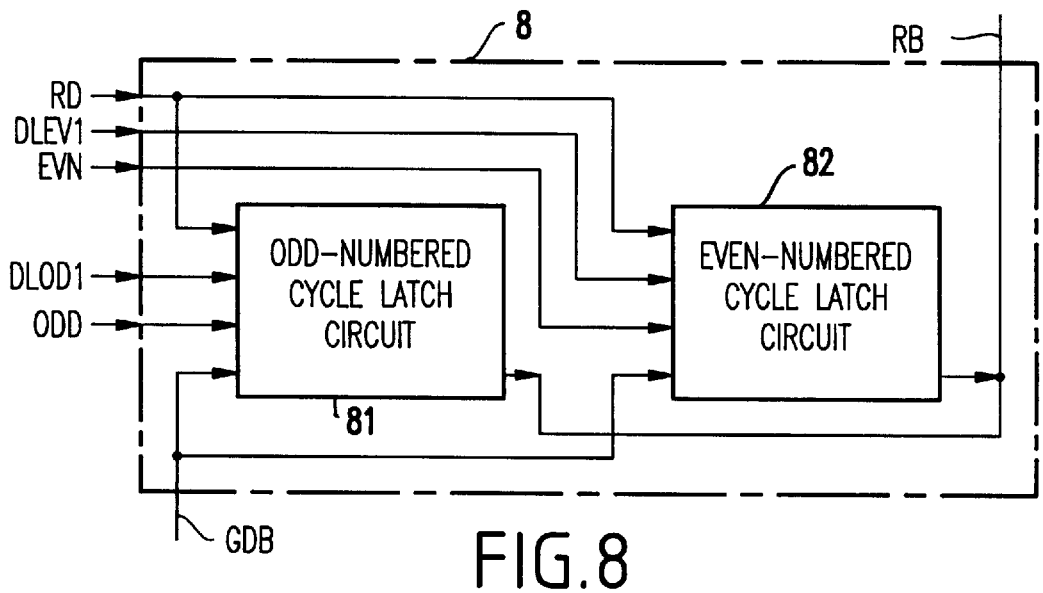
FIG. 8 is a circuit diagram showing a latch circuit 8 of the DRAM system according to the present invention.

FIG. 8 shows a circuit diagram of the latch circuit 8 in detail. The latch circuit 8 includes an odd-numbered cycle latch circuit 81 and an even-numbered cycle latch circuit 82. A construction of the odd-numbered cycle latch circuit 81 and a construction of the even-numbered cycle latch circuit 82 are the same. Therefore, only the odd-numbered cycle latch circuit 81 is explained below.

Figure 9:
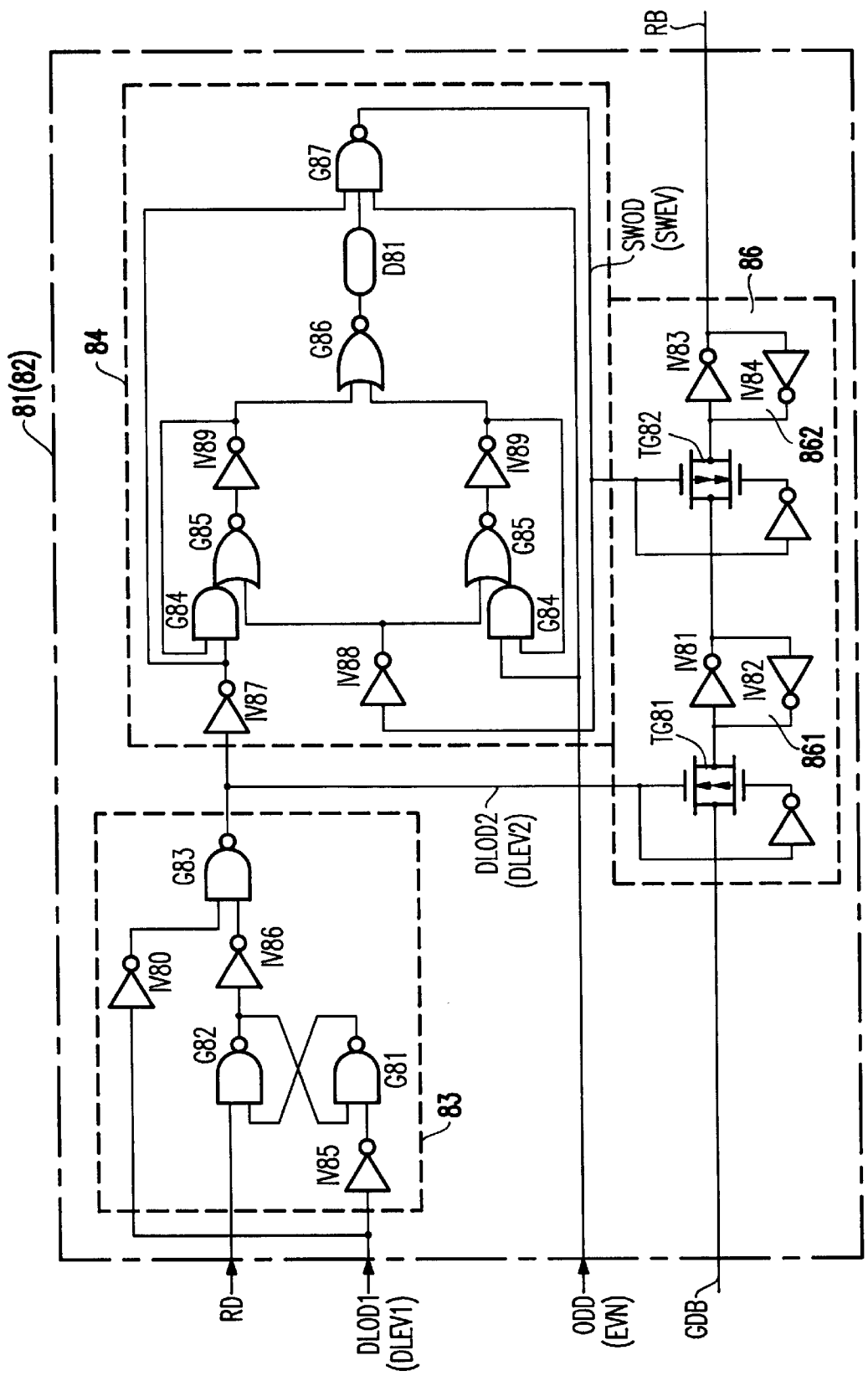
FIG. 9 is a circuit diagram showing an odd-numbered cycle data latch circuit 81 (and an even-numbered cycle data latch circuit 82) according to the present invention.

As shown in FIG. 9, the odd-numbered cycle latch circuit 81 comprises an internal latch circuit 86, and internal control circuits 83 and 84. The internal latch circuit 86 includes first and second latch portions 861 and 862 for holding data on the global data bus GDB and for outputting the held data to an output buffer circuit 9 through the read bus RB.

The internal control circuit 83 generates a latch signal DLOD2 in response to the latch signal DLOD1 and changes its level from an inactive level to an active level when the read control signal RD has an active level.

The internal control circuit 84 receives the latch signal DLOD2 and a CAS latency control signal ODD to generate a switching signal SWOD which is changed to an active level (e.g., "0") with a predetermined pulse width when these received signals have an active level. The predetermined pulse width is determined by a delay circuit D81.

The internal control circuit 83 activates a transfer gate TG81 comprising an N-type transistor and a P-type MOS transistor to latch data on the global data bus GDB in the first latch portion 861 while the latch signal DLOD2 has an inactive level (e.g., "1"), and deactivates the transfer gate TG81 for disconnecting the global data bus GDB from the first latch portion 861 and for keeping the latched data in the first latch portion 861 while the signal DLOD2 has an active level (e.g., "0"). The internal control circuit 84 activates a transfer gate TG82 comprising an N-type transistor and a P-type MOS transistor to latch data stored in the first latch portion 861 while the switching signal SWOD has an active level (e.g., "0"), and keeps the latched data while the signal SWOD has an inactive level (e.g., "1").

IV81–IV89 in FIG. 9 preferably include inverters, and G81–G83 and G87 preferably include NAND circuits. G85 and G86 preferably include NOR circuits, and G84 preferably includes an AND circuit. Of course, other logic designs could be additionally or alternatively employed as would be known by one of ordinary skill in the art taking the present specification as a whole.

The operation of the above-described embodiment will now be described by using the timing charts shown in FIGS. 10–13. FIG. 10 clearly shows an advantage of the embodiment, since, as shown, the device 1001 can output correct data although the sense amplifier 6 outputs data corresponding to data k in FIG. 10 on the global data bus GDB after the clock CK in time T1 has already occurred.

FIG. 10 is a timing chart for the CAS latency "2" when the CPU 101 operates with high operating frequency (e.g., the frequency of the clock signal CK is relatively high).

The column address AD is received by the device 1001 when the CPU 101 outputs a clock signal CK in time T0. The load signal LD is changed to an active level during time T0 in response to the clock signal CK. Therefore, the address IAC is outputted by the column address generator 4, and the column decoder 5 changes a corresponding signal among the signals CS1–CSn to an active level in response to the address IAC. The time from receiving the column address AD to changing a corresponding signal among signals CS1–CSn is inherent (e.g., in "real-time" depending on device characteristics). Therefore, it is constant irrespective of the ability of a CPU connected to the device 1001.

In FIG. 10, a corresponding signal CSk (e.g., where "k" is an integer greater than or equal to 1) is changed to an active level before a clock CK in time T1 has occurred, and a corresponding data is amplified by the sense amplifier 6. Then, the amplified data is outputted to the global data bus GDB. In FIG. 10, k (e.g., where "k" is an integer greater than or equal to 1) is the corresponding data. The time from receiving the column address AD to outputting the corresponding data k is also inherent (real-time), because no latch circuit is in the path between receiving the column address AD to outputting the corresponding data k.

The read control signal RD and the output control signal OE are changed at the same timing as in the related art system described above.

When the latch signal DLOD2 has an inactive level (e.g., "1"), the first latch portion 861 stores data on the global data bus GDB because the transfer gate TG81 becomes (turns) "ON". Therefore, the first latch portion 861 stores the data k as soon as the sense amplifier 6 outputs the data k. Then, the first latch portion 861 keeps the data k, and thereafter the latch signal DLOD2 is changed to an active level (e.g., "0") because the transfer gate TG81 turns "OFF". In FIG. 10, the latch signal DLOD2 still has an inactive level after a clock CK in time T1 has occurred. Therefore, the first latch portion 861 can store the data k even if the data k is outputted after a clock CK in time T1. This is an important feature of the invention, as discussed further below.

Then, the stored data k in the first latch portion 861 is outputted to the read bus RB because the transfer gate TG82 turns "ON" after a predetermined time as controlled by the internal control circuit 84. According to the construction shown in FIG. 9, the signal SWOD is changed to an active level (e.g. "0") from an inactive level (e.g., "1"), and thereafter the latch signal DLOD2 is changed to an active level. Therefore, the latched data k is outputted to the read bus RB correctly as shown in FIG. 10.

Similarly, the even-numbered cycle latch circuit 82 latches data k+1 on the global data bus GDB, and outputs the data k+1 to the read bus RB during a time T2.

As mentioned above, the device 1001 can output correct data to the CPU 101 even if the operating frequency is faster than the time outputting the data k. Further, the even-numbered cycle latch circuit 82 or the odd-numbered cycle latch circuit 81 are unable to latch two consecutive (sequential) data outputted on the global data bus GDB (e.g., data k and data k+1) during a term (e.g., a time T1), because the odd-numbered cycle latch circuit 81 latches data k, k+2, . . . (e.g., where "k" is an integer greater than or equal to 1) and the even-numbered cycle latch circuit 82 latches data k+1, k+3, . . . Thus, two latches are provided, one for the odd data and one for the even data. By alternating data into the odd and even latches, a sequential and continuous data transfer operation can be performed.

FIG. 11 is a timing chart for the CAS latency "2" when the CPU 101 has a low operating frequency (e.g., the frequency of the clock signal CK is low), FIG. 12 is a timing chart for the CAS latency "3" when the CPU 101 has a high operating frequency (e.g., the frequency of the clock signal CK is high) and FIG. 13 is a timing chart for the CAS latency "3" when the CPU 101 operates with low operating frequency (e.g., the frequency of the clock signal CK is low). However, as shown in the figures, the data k on the global bus line GDB is outputted at the same timing as in the related art system. Therefore, explanations of these figures are omitted because they are only examples to show that this embodiment is operable correctly.

As mentioned above, the chip 1001 has a construction of a 16-Mbit DRAM device. However, as known by one of ordinary skill in the art taking the present specification as a whole, the construction can be changed depending on the design of the memory system (e.g., a 64-Mbit DRAM).

While the invention has been described in terms of a preferred embodiment, those skilled in the art will recognize that the invention can be practiced with modification within the spirit and scope of the appended claims.

Having thus described my invention, what I claim as new and desire to secure by Letters Patent is as follows:

1. A synchronous dynamic random access memory (DRAM) system, comprising:
   a signal generator for receiving a first clock signal and a second clock signal sequentially, and for outputting a first latch signal after receiving the first clock signal and before receiving the second clock signal;
   a selecting circuit for selecting a first DRAM cell in a memory cell array in response to a first address signal, and for outputting first data of said first DRAM cell after the first clock signal is received by said signal generator; and
   a latch circuit for latching said first data when the first latch signal is outputted.

2. The synchronous DRAM system as recited in claim 1, wherein said selecting circuit comprises:
   a column address generator for generating a second address signal based on the first address signal,
   wherein said selecting circuit further selects a second DRAM cell in the memory cell array in response to the second address signal, and outputs second data of said second DRAM cell after the second clock signal is received by said signal generator.

3. The synchronous DRAM system as recited in claim 2, wherein said signal generator further receives a third clock signal after receiving the second clock signal, and outputs a second latch signal after receiving the second clock signal and before receiving the third clock signal.

4. The synchronous DRAM system as recited in claim 3, wherein said latch circuit comprises:
   a first storage circuit for receiving the first latch signal and for latching said first data when the first latch signal is outputted; and
   a second storage circuit for receiving the second latch signal and for latching said second data when the second latch signal is outputted.

5. The synchronous DRAM system as recited in claim 4, wherein said first storage circuit and said second storage circuit have a same construction.

6. The synchronous DRAM system as recited in claim 5, wherein each of said first and second storage circuits comprises:
   a first latch portion for receiving one of the first and the second latch signals and for latching respectively one of the first and the second data when the respective one of the first and the second latch signals has been received;
   an output controller for receiving the one of the first and second latch signals and for outputting an output control signal after the one of the first and the second latch signals has been received by said first latch portion; and
   a second latch portion for receiving the output control signal, for latching data latched by said first latch portion based on the output control signal and for outputting the data latched by said first latch portion.

7. The synchronous DRAM system as recited in claim 6, wherein said synchronous DRAM system is formed on a single semiconductor chip.

8. The synchronous DRAM system as recited in claim 7, wherein the memory system is operated by an off-chip central processing unit (CPU).

9. A method of reading data from a synchronous dynamic random access memory (DRAM) system, comprising steps of:
   receiving, by a signal generator, a first clock signal and a second clock signal sequentially;
   outputting, by said signal generator, a first latch signal after receiving the first clock signal and before receiving the second clock signal;
   selecting, by a selector, a first DRAM cell in a memory cell array in response to a first address signal;
   outputting, by said selector, first data of said first DRAM cell after the first clock signal is received; and
   latching, by a latch, said first data based on the first latch signal.

10. The method as recited in claim 9, further comprising steps of:
    generating, by said selector, a second address signal based on the first address signal;
    selecting a second DRAM cell in the memory cell array in response to the second address signal; and
    outputting second data of said second DRAM cell after the second clock signal is received.

11. The method as recited in claim 10, further comprising steps of:
    receiving, by said signal generator, a third clock signal after receiving the second clock signal; and
    outputting, by said signal generator, a second latch signal after receiving the second clock signal and before receiving the third clock signal.

12. The method as recited in claim 11, further comprising steps of:
    receiving, by a first storage of said latch, the first latch signal;

latching, by said first storage, said first data when the first latch signal is outputted;

receiving, by a second storage of said latch, the second latch signal; and latching, by said second storage, said second data based on the second latch signal.

13. A memory system, comprising:

a signal generator for receiving a first clock signal and a second clock signal sequentially, and for outputting a first latch signal after receiving the first clock signal and before receiving the second clock signal;

a selecting circuit for selecting a first memory cell in a memory cell array in response to a first address signal, and for outputting first data of said first memory cell after the first clock signal is received by said signal generator; and a latch circuit for latching said first data based on the first latch signal.

14. The memory system as recited in claim 13, wherein said selecting circuit comprises:

a column address generator for generating a second address signal based on the first address signal, wherein said selecting circuit further selects a second memory cell in the memory cell array in response to the second address signal, and outputs second data of said second memory cell after the second clock signal is received by said signal generator.

15. The memory system as recited in claim 14, wherein said signal generator further receives a third clock signal after receiving the second clock signal, and outputs a second latch signal after receiving the second clock signal and before receiving the third clock signal.

16. The memory system as recited in claim 15, wherein said latch circuit comprises:

a first storage circuit for receiving the first latch signal and for latching said first data based on the first latch signal; and a second storage circuit for receiving the second latch signal and for latching said second data based on the second latch signal.

17. The memory system as recited in claim 16, wherein said first storage circuit and said second storage circuit have a same construction.

18. The memory system as recited in claim 17, wherein each of said first and second storage circuits comprises:

a first portion for receiving one of the first and the second latch signals and for latching respectively one of the first and the second data when the respective one of the first and the second latch signals has been received;

an output controller for receiving the one of the first and second latch signals and for outputting an output control signal after the one of the first and the second latch signals has been received by said first portion; and a second portion for receiving the output control signal, for latching data latched by said first portion based on the output control signal and for outputting the data latched by said first portion.

19. The memory system as recited in claim 18, wherein said memory system is formed on a single semiconductor chip.

20. The memory system as recited in claim 19, wherein the memory system is operated by an off-chip central processing unit (CPU) and comprises a synchronous dynamic random access memory (DRAM) system.

* * * * *